US010896939B2

(12) United States Patent
Jeon et al.

(10) Patent No.: US 10,896,939 B2
(45) Date of Patent: Jan. 19, 2021

(54) ORGANIC LIGHT-EMITTING DISPLAY DEVICE INCLUDING PIXEL DEFINING LAYER WITH OPENINGS AND BLACK MATRIX WITH OPENINGS

(71) Applicant: SAMSUNG DISPLAY CO., LTD., Yongin-si (KR)

(72) Inventors: Haseok Jeon, Yongin-si (KR); Dohyun Kwon, Yongin-si (KR); Choongyoul Im, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 31 days.

(21) Appl. No.: 16/270,256

(22) Filed: Feb. 7, 2019

(65) Prior Publication Data

US 2019/0245017 A1    Aug. 8, 2019

(30) Foreign Application Priority Data

Feb. 8, 2018    (KR) .................. 10-2018-0015803

(51) Int. Cl.
*H01L 27/32* (2006.01)
*H01L 51/52* (2006.01)

(52) U.S. Cl.
CPC ........ *H01L 27/3246* (2013.01); *H01L 27/322* (2013.01); *H01L 27/323* (2013.01);
(Continued)

(58) Field of Classification Search
CPC ............ H01L 51/5256; H01L 51/5284; H01L 27/323; H01L 27/3216; H01L 27/3246;
(Continued)

(56) References Cited

U.S. PATENT DOCUMENTS 6,225,750 B1    5/2001 Kimura
9,859,354 B2    1/2018 Kang et al.
(Continued)

FOREIGN PATENT DOCUMENTS

JP    2000-284727    10/2000
JP    2005-122101    5/2005
(Continued)

*Primary Examiner* — Kwang-Su Yang (74) *Attorney, Agent, or Firm* — F. Chau & Associates, LLC (57) ABSTRACT

An organic light-emitting display device includes a plurality of pixels. Each of the pixels includes a first electrode, a second electrode, and an organic emission layer between the first electrode and the second electrode. The display device further includes a pixel-defining layer surrounding an outer portion of the first electrode and including a plurality of circular first openings, each of the circular first openings overlapping at least a portion of a respective pixel of the plurality of pixels. The display device additionally includes an encapsulation layer arranged on the second electrode, a black matrix arranged on the encapsulation layer and including a plurality of circular second openings, each of the circular second openings overlapping a respective circular first opening of the plurality of circular first openings, and a plurality of color filters, each of the color filters overlapping a respective circular second opening of the plurality of circular second openings.

19 Claims, 7 Drawing Sheets

(52) U.S. Cl.
CPC ...... *H01L 27/3211* (2013.01); *H01L 27/3216* (2013.01); *H01L 27/3218* (2013.01); *H01L 27/3262* (2013.01); *H01L 27/3272* (2013.01); *H01L 51/5256* (2013.01); *H01L 51/5284* (2013.01); *H01L 27/3276* (2013.01)

(58) Field of Classification Search
CPC ............. H01L 27/3218; H01L 27/3262; H01L 27/3272; H01L 27/322; H01L 27/3211; H01L 27/3276
See application file for complete search history.

(56) References Cited

U.S. PATENT DOCUMENTS

| | | | | |
|---|---|---|---|---|
| 2011/0198596 | A1* | 8/2011 | Park | H01L 27/3246 |
| | | | | 257/59 |
| 2013/0228801 | A1* | 9/2013 | Lee | H01L 51/5268 |
| | | | | 257/88 |
| 2014/0231790 | A1* | 8/2014 | Fujino | H01L 27/3213 |
| | | | | 257/40 |
| 2014/0285542 | A1* | 9/2014 | Izumi | G09G 3/3233 |
| | | | | 345/694 |
| 2015/0185942 | A1* | 7/2015 | Kim | G06F 3/0412 |
| | | | | 345/173 |
| 2016/0104750 | A1* | 4/2016 | Jinta | H01L 27/3218 |
| | | | | 257/40 |
| 2016/0124262 | A1 | 5/2016 | Wu | |
| 2016/0322444 | A1* | 11/2016 | Kang | H01L 27/322 |
| 2016/0351857 | A1 | 12/2016 | Kwong | |
| 2017/0338444 | A1* | 11/2017 | Teramoto | H01L 27/3211 |
| 2018/0350885 | A1* | 12/2018 | Choi | H01L 51/5221 |
| 2020/0044184 | A1* | 2/2020 | Wan | H01L 51/5221 |

FOREIGN PATENT DOCUMENTS

| | | |
|---|---|---|
| KR | 10-2016-0081704 | 7/2016 |
| KR | 10-2016-0130071 | 11/2016 |

* cited by examiner

ORGANIC LIGHT-EMITTING DISPLAY DEVICE INCLUDING PIXEL DEFINING LAYER WITH OPENINGS AND BLACK MATRIX WITH OPENINGS

CROSS-REFERENCE TO RELATED APPLICATION

This application claims priority under 35 U.S.C. § 119 to Korean Patent Application No. 10-2018-0015803, filed on Feb. 8, 2018, in the Korean Intellectual Property Office, the disclosure of which is incorporated by reference herein in its entirety.

TECHNICAL FIELD

One or more exemplary embodiments of the present invention relate to an organic light-emitting display device, and more particularly, to an organic light-emitting display device including a pixel defining layer with openings and a black matrix with openings.

DISCUSSION OF THE RELATED ART

An organic light-emitting display device includes a hole injection electrode, an electron injection electrode, and an organic light-emitting diode including an emission layer. The organic light-emitting display device is a self-emissive display device in which an electron injected from the electron injection electrode and a hole injected from the hole injection electrode are coupled with one another to generate an exciton in the emission layer. As an electron of the exciton relaxes, a photon is emitted, thereby enabling the organic light-emitting display to emit light.

Since the organic light-emitting display device does not require a separate light source, it may be driven with a low voltage, and may be light and thin. Further, since the organic light-emitting display device has excellent characteristics in terms of viewing angles, contrast, and response speeds, the range of applications of such devices is expanding from personal portable apparatuses, such as MP3 players or mobile phones, to televisions (TVs).

SUMMARY

According to an exemplary embodiment of the present invention, an organic light-emitting display device includes a plurality of pixels. Each of the plurality of pixels includes a first electrode, a second electrode, and an organic emission layer arranged between the first electrode and the second electrode. The display device further includes a pixel-defining layer surrounding an outer portion of the first electrode and including a plurality of circular first openings, each of the plurality of circular first openings overlapping at least a portion of a respective pixel of the plurality of pixels. The display device additionally includes an encapsulation layer arranged on the second electrode, a black matrix arranged on the encapsulation layer and including a plurality of circular second openings, each of the plurality of circular second openings overlapping a respective circular first opening of the plurality of circular first openings, and a plurality of color filters, each of the plurality of color filters overlapping a respective circular second opening of the plurality of circular second openings.

In an exemplary embodiment of the present invention, the pixel-defining layer includes a light-blocking material.

In an exemplary embodiment of the present invention, the light-blocking material includes at least one of carbon black, a carbon nano tube (CNT), or a black dye.

In an exemplary embodiment of the present invention, each of the plurality of circular second openings is larger than each of the plurality of circular first openings.

In an exemplary embodiment of the present invention, the black matrix includes a light-blocking material.

In an exemplary embodiment of the present invention, the light-blocking material includes at least one of carbon black, a carbon nano tube (CNT), or a black dye.

In an exemplary embodiment of the present invention, the black matrix is further arranged outside of a display area of the organic light-emitting display device, and the plurality of pixels is arranged in the display area.

In an exemplary embodiment of the present invention, the encapsulation layer includes at least one inorganic layer and at least one organic layer.

In an exemplary embodiment of the present invention, the display device further includes a touch sensing layer arranged between the encapsulation layer and the color filters.

In an exemplary embodiment of the present invention, the color filters filter colors in different bands.

According to an exemplary embodiment of the present invention, an organic light-emitting display device includes a plurality of pixels. Each of the plurality of pixels includes a first electrode, a second electrode arranged in common over the plurality of pixels, and an organic emission layer arranged between the first electrode and the second electrode. The display device further includes a pixel-defining layer surrounding a portion of the first electrode and including a first opening overlapping a first pixel of the plurality of pixels. The display device additionally includes an encapsulation layer arranged on the second electrode, a black matrix arranged on the encapsulation layer and including a circular second opening overlapping the first opening. The display device further includes a first color filter of a plurality of color filters, the first color filter overlapping the circular second opening.

In an exemplary embodiment of the present invention, the first electrode includes a reflective material.

In an exemplary embodiment of the present invention, the pixel-defining layer includes a light-transmissive material.

In an exemplary embodiment of the present invention, the circular second opening is larger than the first electrode.

In an exemplary embodiment of the present invention, the black matrix includes a light-blocking material.

In an exemplary embodiment of the present invention, the black matrix is further arranged outside of a display area of the organic light-emitting display device, and the plurality of pixels is arranged in the display area.

In an exemplary embodiment of the present invention, the first opening has a circular shape.

In an exemplary embodiment of the present invention, the encapsulation layer includes at least one inorganic layer and at least one organic layer.

In an exemplary embodiment of the present invention, the display device further includes a touch sensing layer arranged between the encapsulation layer and the color filters.

In an exemplary embodiment of the present invention, the color filters filter colors in different bands.

In an exemplary embodiment of the present invention, the first electrode has a circular shape.

BRIEF DESCRIPTION OF THE DRAWINGS

Exemplary embodiments of the present invention will be more clearly understood by describing in detail exemplary embodiments thereof with reference to the accompanying drawings, in which.

DETAILED DESCRIPTION OF THE EMBODIMENTS

Hereinafter, exemplary embodiments of the present invention will be described more fully with reference to the accompanying drawings. When a description is made with reference to the drawings, like reference numerals in the drawings may denote like or corresponding elements, and repeated descriptions thereof may be omitted.

It will be understood that when a component, such as a layer, a film, a region, or a plate, is referred to as being "on" another component, the component can be directly on the other component or intervening components may be present thereon. Sizes of elements in the drawings may be exaggerated for convenience of explanation.

Figure 1:
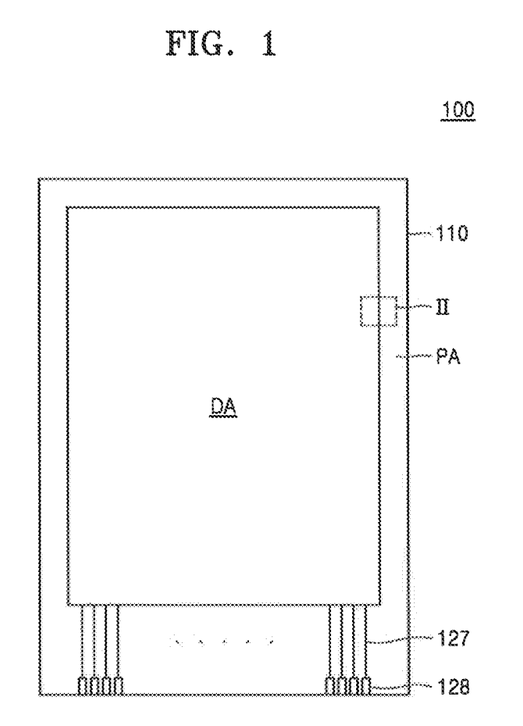
FIG. 1 is a plan view of an organic light-emitting display device according to an exemplary embodiment of the present invention.
Figure 2:
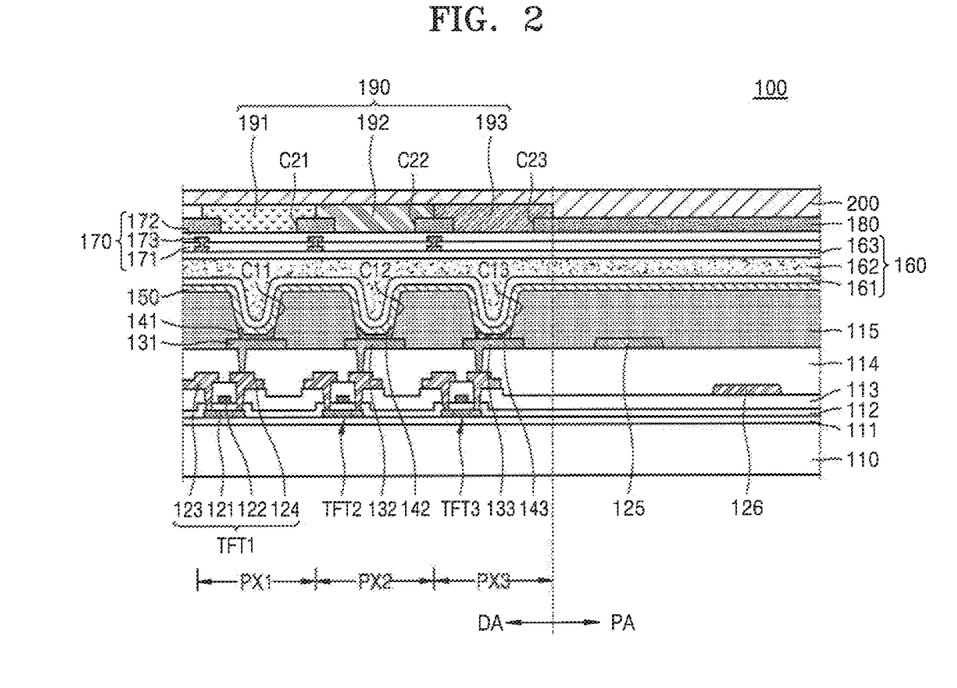
FIG. 2 is a cross-sectional view of a portion II of the organic light-emitting display device illustrated in FIG. 1.
Figure 3:
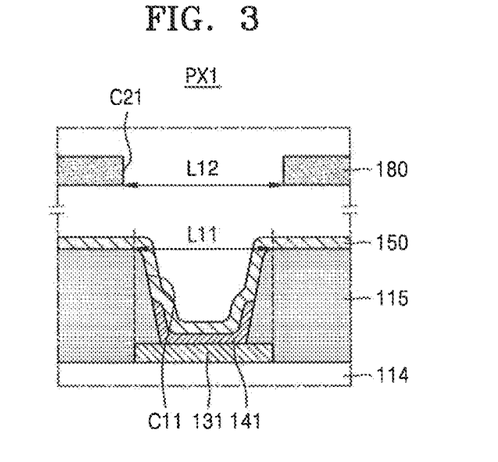
FIG. 3 is a cross-sectional view of a portion of a first pixel of FIG. 2.
Figure 4:
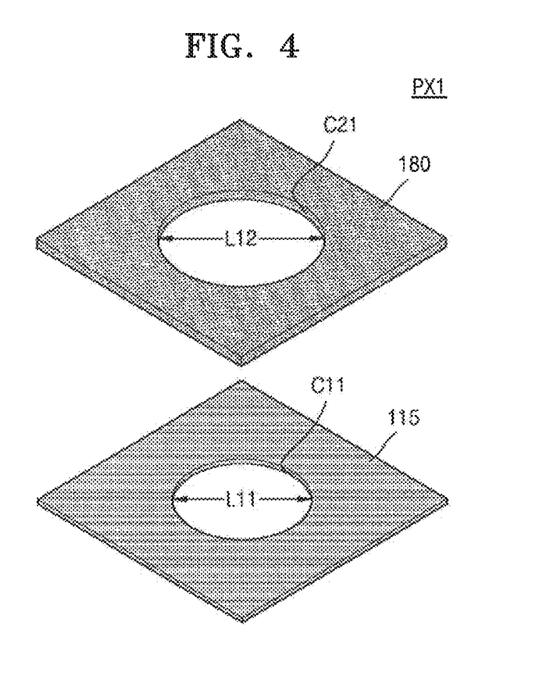
FIG. 4 is a perspective view of a portion of a first pixel of FIG. 2.

FIG. 1 is a plan view of an organic light-emitting display device 100 according to an exemplary embodiment of the present invention, FIG. 2 is a cross-sectional view of a portion II of the organic light-emitting display device 100 illustrated in FIG. 1, FIG. 3 is a cross-sectional view of a portion of a first pixel PX1 of FIG. 2, and FIG. 4 is a perspective view of a portion of the first pixel PX1 of FIG. 2.

Referring to FIGS. 1 to 4, the organic light-emitting display device 100, according to an exemplary embodiment of the present invention, includes first, second, and third pixels PX1, PX2, and PX3 (hereinafter, also referred to as a plurality of pixels PX1, PX2, and PX3), a pixel-defining layer 115 including circular first openings C11, C12, and C13, an encapsulation layer 160, a black matrix 180 including circular second openings C21, C22, and C23, and a color filter 190.

Each of the pixels PX1, PX2 and PX3 may include the pixel-defining layer 115 and the black matrix 180. The pixel-defining layer 115 includes the circular first openings C11, C12, and C13, and the black matrix 180 overlaps the first openings C11, C12, and C13 and includes the circular second openings C21, C22, and C23. Accordingly, a phenomenon in which color of light emitted from the display device 100 is separated or spread when external light incident from the outside of the organic light-emitting display device 100 is reflected from an inside of the display device 100.

Hereinafter, the organic light-emitting display device 100 is described in detail.

Referring to FIG. 1, the organic light-emitting display device 100 includes a display area DA and a peripheral area PA, which is a non-display area outside the display area DA, on a substrate 110. For example, the peripheral area PA may at least partially surround the display area DA. The display area DA includes the pixels PX1, PX2, and PX3. A scan line, a signal line such as a data line, and a power line 127, such as a driving voltage line electrically connected to the pixels PX1, PX2, and PX3, are electrically connected to a pad electrode 128.

Referring to FIG. 2, a plurality of thin film transistors TFT1, TFT2, and TFT3 are arranged (e.g., disposed) on the substrate 110 (hereinafter, also referred to as the first, second, and third thin film transistors TFT1, TFT2, and TFT3). For example, the plurality of thin film transistors TFT1, TFT2, and TFT3 may be arranged over the substrate 110.

The substrate 110 may include various materials such as a glass material, a metal material, or a plastic material. For example, the substrate 110 may be a flexible substrate including a polymer resin such as polyethersulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), and/or cellulose acetate propionate (CAP).

The display area DA is an area displaying an image and may include the thin film transistors TFT1, TFT2, and TFT3, and the pixels PX1, PX2, and PX3 disposed in the display area DA are electrically connected to the thin film transistors TFT1, TFT2, and TFT3, respectively. Though not shown in FIG. 2, each pixel may include at least two thin film transistors and at least one capacitor.

A buffer layer 111 including an inorganic material such as silicon oxide, silicon nitride, and/or silicon oxynitride may be arranged between the first thin film transistor TFT1 and the substrate 110. The buffer layer 111 may increase planarization of an upper surface of the substrate 110 and/or prevent or reduce penetration of impurities into a semiconductor layer 121 through the substrate 110.

The first thin film transistor TFT1 may include the semiconductor layer 121, a gate electrode 122, a source electrode 123, and a drain electrode 124.

The semiconductor layer 121 may include, for example, amorphous silicon, polycrystalline silicon, or an organic semiconductor material.

The gate electrode 122 is arranged on the semiconductor layer 121. The source electrode 123 electrically communicates with the drain electrode 124 depending on a signal applied to the gate electrode 122. For example, the first pixel PX1 may receive a data signal through the source electrode 123 and the drain electrode 124 in response to a signal received by the gate electrode 122. The gate electrode 122 may include a single layer or a multi-layer including, for example, at least one of Al, Pt, Pd, Ag, Mg, Au, Ni, Nd, Ir, Cr, Li, Ca, Mo, Ti, W, and Cu by taking into account space, a surface planarization characteristic of a stacked layer, processability, etc.

To secure insulation between the semiconductor layer 121 and the gate electrode 122, a gate insulating layer 112 including an inorganic material such as silicon oxide, silicon nitride, and/or silicon oxynitride may be arranged between the semiconductor layer 121 and the gate electrode 122.

An interlayer insulating layer 113 including an inorganic material such as silicon oxide, silicon nitride, and/or silicon oxynitride is arranged on the gate electrode 122.

The source electrode 123 and the drain electrode 124 are arranged on the interlayer insulating layer 113. The source electrode 123 and the drain electrode 124 are electrically connected to the semiconductor layer 121 through contact holes in the interlayer insulating layer 113 and the gate insulating layer 112. For example, the source electrode 123 and the drain electrode 124 may be connected to a source region and a drain region of the semiconductor layer 121, respectively.

The source electrode 123 and the drain electrode 124 may include a single layer or a multi-layer including at least one of, for example, Al, Pt, Pd, Ag, Mg, Au, Ni, Nd, Ir, Cr, Li, Ca, Mo, Ti, W, and/or Cu.

The second thin film transistor TFT2 arranged in the second pixel PX2, and the third thin film transistor TFT3 arranged in the third pixel PX3 may include the same material and the same structure as those of the first thin film transistor TFT1. In addition, the second thin film transistor TFT2 and the third thin film transistor TFT3 may include a material and a structure different from those of the first thin film transistor TFT1. In addition, the present invention is not limited to the illustrated structures of the thin film transistors TFT1, TFT2, and TFT3.

Various structures and wirings may be arranged in the peripheral area PA of the substrate 110. As an example, FIG. 2 illustrates a first power supply line 125 configured to apply low voltage power to an organic light-emitting diode and a second power supply line 126 configured to apply high voltage power to the organic light-emitting diode.

A planarization layer 114 is arranged on the thin film transistors TFT1, TFT2, and TFT3 to provide a flat surface. The planarization layer 114 may include an organic insulating layer or an inorganic insulating layer, or the planarization layer 114 may include a composite configuration of an organic insulating material and an inorganic insulating material. For example, the planarization layer 114 may include an organic material such as acrylic, benzocyclobutene (BCB), PI, and/or hexamethyldisiloxane (HMDSO).

In the display area DA, a first pixel electrode 131, a second pixel electrode 132, and a third pixel electrode 133 are arranged on the planarization layer 114 (hereinafter, also referred to as the plurality of pixel electrodes 131, 132, and 133). The first, second, and third pixel electrodes 131, 132, and 133 are respectively connected to the drain electrodes 124 of each of the thin film transistors TFT1, TFT2, and TFT3 through via holes in the planarization layer 114.

Each of the pixel electrodes 131, 132, and 133 may include a reflective electrode or a transflective electrode. In the case where the pixel electrode includes a reflective electrode, the pixel electrode may include a reflective layer including at least one of Ag, Mg, Al, Pt, Pd, Au, Ni, Nd, Ir, Cr and/or a compound thereof, and a transparent conductive layer arranged on the reflective layer. For example, the transparent conductive layer may be arranged under the reflective layer. The transparent conductive layer may include at least one of ITO, IZO, ZnO, $In_2O_3$, IGO, and/or AZO.

An intermediate layer including first, second, and third organic emission layers 141, 142, and 143 (hereinafter, also referred to as the plurality of organic emission layers 141, 142, and 143) may be arranged on the first, second, and third pixel electrodes 131, 132, and 133.

The intermediate layer may include a low molecular weight material or polymer material. In the case where the intermediate layer includes a low molecular weight material, the intermediate layer may have a structure in which a hole injection layer (HIL), a hole transport layer (HTL), an electron transport layer (ETL), an electron injection layer (EIL), etc. are stacked in a single or a composite configuration (e.g., a multi-layered structure), and the intermediate layer may include various organic materials such as copper phthalocyanine (CuPc), N,N'-Di(naphthalene-1-yl)-N,N'-diphenyl-benzidine (NPB), and tris-8-hydroxyquinoline aluminum (Alq3). The intermediate layer may be formed by various methods such as vacuum deposition.

In the case where the intermediate layer includes a polymer material, the intermediate layer may generally include an HTL. In this case, the HTL may include PEDOT, and the emission layer may include a polymer material such as a polyphenylene vinylene (PPV)-based material and a polyfluorene-based material. The intermediate layer may be formed by various methods such as screen printing or inkjet printing, and laser induced thermal imaging (LITI).

For example, the intermediate layer may be a layer having one body extending over the plurality of pixel electrodes 131, 132, and 133, or may be a layer that is patterned to correspond to the respective pixel electrodes 131, 132, and 133. In other words, the intermediate layer could be a plurality of intermediate layers disposed on the pixel electrodes 131, 132 and 133, respectively.

A common electrode 150 is provided on the organic emission layers 141, 142, and 143, respectively, of the pixels PX1, PX2, and PX3 as one body with respect to all pixels.

The common electrode 150 may include a transmissive electrode. In the case where the common electrode 150 includes a transmissive electrode, the common electrode 150 may include at least one of Ag, Al, Mg, Li, Ca, Cu, LiF/Ca, LiF/Al, MgAg, and/or CaAg. In addition, the common electrode 150 may include a relatively thin layer. For example, the common electrode 150 may have a thickness ranging from several nanometers (nm) to tens of nanometers. As an additional example, the thickness of the common electrode 150 may range from about 1 nm to about 99 nm.

The pixel-defining layer 115 is provided between the pixel electrodes 131, 132, and 133 and the common electrode 150.

The pixel-defining layer 115 surrounds edges of the pixel electrodes 131, 132, and 133, and includes the circular first openings C11, C12, and C13 exposing central portions of the pixel electrodes 131, 132, and 133. The first openings C11, C12, and C13 may have different diameters from one another. However, the present invention is not limited thereto. For example, the first openings C11, C12, and C13 may have substantially the same diameter as one another.

The pixel-defining layer 115 may prevent an arc from occurring at the edges of the pixel electrodes 131, 132, and 133 by increasing distances between the pixel electrodes 131, 132, and 133 and the common electrode 150.

The pixel-defining layer 115 may include an organic material, for example, PI or HMDSO. In an exemplary embodiment of the present invention, the pixel-defining layer 115 surrounds outer edges of the pixel electrodes 131, 132, and 133 and includes a light-blocking material including the circular first openings C11, C12, and C13. The light-blocking material may include carbon black, a carbon nano tube (CNT), and/or a black dye. A shape, material, and size of the first openings C11, C12, and C13 of the pixel-defining layer 115 are described below.

The encapsulation layer 160 covering the display area DA is arranged on the common electrode 150. The encapsulation layer 160 may cover and/or encapsulate the organic light-emitting diode to suppress deterioration of the organic light-emitting diode by moisture and oxygen included in external environment. As illustrated in FIG. 2, the encapsulation layer 160 may include a first inorganic layer 161, an organic layer 162, and a second inorganic layer 163.

The first inorganic layer 161 may include, for example, silicon oxide, silicon nitride, and/or silicon oxynitride.

The organic layer 162 may cover the first inorganic layer 161 that is not flat, and an upper surface of the organic layer 162 may be substantially flat. For example, the organic layer 162 may include at least one of PET, PEN, PC, PI, polyethylene sulfonate, poly oxymethylene, polyarylate, PAR, and/or HMDSO.

The second inorganic layer 163 may cover the organic layer 162 and include, for example, silicon oxide, silicon nitride, and/or silicon oxynitride.

Since the encapsulation layer 160 has a multi-layered structure including the first inorganic layer 161, the organic layer 162, and the second inorganic layer 163, in the case where a crack occurs in the encapsulation layer 160, the encapsulation layer 160 may prevent the crack from spreading between the first inorganic layer 161 and the organic layer 162, or between the organic layer 162 and the second inorganic layer 163. The encapsulation layer 160 may prevent or reduce formation of a path through which external moisture and/or oxygen may penetrate to reach the display area DA.

Though not shown in FIG. 2, a capping layer configured to improve light efficiency or protect the organic light-emitting diode may be provided between the common electrode 150 and the encapsulation layer 160.

A touch sense layer 170 is provided on the encapsulation layer 160. The touch sense layer 170 includes a first insulating layer 171, a second insulating layer 172 on the first insulating layer 171, and a plurality of touch electrodes 173 disposed between the first insulating layer 171 and the second insulating layer 172. The touch electrodes 173 is not limited to a structure illustrated in FIG. 2 and may include various structures such as a mesh pattern and a transparent segment structure.

The touch sense layer 170 may sense a touch input based on a mutual capacitance change induced by the touch input. For example, when the touch input is performed, a mutual capacitance is changed by the touch input. In addition, a touch sense unit connected to the touch sense layer 170 detects a location in which the mutual capacitance has changed, and thus, the touch input may be sensed. However, the present invention is not limited thereto.

The black matrix 180 and the color filter 190 are arranged on the touch sense layer 170.

The black matrix 180 includes a material which may block light. For example, the black matrix 180 may include at least one of, for example, carbon black, a carbon nano tube (CNT), a black pigment, and a black dye. The black matrix 180 may include a photosensitive organic material, and include a coloring agent such as pigment or dye. The black matrix 180 may have a single-layered or multi-layered structure.

The black matrix 180 of the display area DA includes circular second openings C21, C22, and C23 which expose emission regions of the respective pixels PX1, PX2, and PX3. The second openings C21, C22, and C23 of the black matrix 180 respectively overlap the first openings C11, C12, and C13 in the pixel-defining layer 115 of the respective pixels PX1, PX2, and PX3, and the second openings C21, C22, and C23 are larger than the first openings C11, C12, and C13 in the pixel-defining layer 115. For example, the second openings C21, C22, and C23 may have a diameter that is larger than that of the first openings C11, C12, and C13.

For example, referring to FIGS. 3 and 4, a diameter L12 of the second opening C21 of the black matrix 180 overlapping the first pixel PX1 is greater than a diameter L11 of the first opening C11 in the pixel-defining layer 115. When a size of the second opening C21 of the black matrix 180 increases, lateral visibility of the organic light-emitting display device 100 may increase.

The black matrix 180 of the peripheral area PA may overlap the peripheral area PA without an opening. For example, the black matrix 180 may completely overlap the peripheral area PA or may partially overlap the peripheral area PA. The black matrix 180 overlapping the peripheral area PA may reduce reflection of external light by including various wirings arranged in the peripheral area PA.

The color filter 190 is arranged in the emission regions of the respective pixels PX1, PX2, and PX3. For example, the color filter 190 may overlap the pixels PX1, PX2 and PX3.

The color filter 190 may include a plurality of color filters corresponding to the emission regions of the respective pixels (hereinafter, also referred to as the first, second, and third color filters 191, 192, and 193). For example, in the case where the first pixel PX1 emits red light, the first color filter 191 may filter the red light. In the case where the second pixel PX2 emits green light, the second color filter 192 may filter the green light. In the case where the third pixel PX3 emits blue light, the third color filter 193 may filter the blue light.

The color filter 190 may not only filter light generated from the organic light-emitting diode to transmit the light to the outside, but may reduce reflectivity of external light incident from the outside. While external light passes through the color filter 190, an amount of the external light may be reduced to about ⅓.

Reflected external light is incident to the first, second, and third color filters 191, 192, and 193, respectively, of the first, second, and third pixels PX1, PX2, and PX3, and brightness of the reflected external light may be reduced while the reflected external light passes through the color filters 191, 192, and 193. Consequently, since only a portion of the external light may be reflected from the organic light-emitting display device 100 and thus emitted, external light reflection may be reduced.

Though FIG. 2 illustrates that the color filters 191, 192, and 193 cover a portion of the black matrix 180, the black matrix 180 may cover a portion of the color filters 191, 192, and 193 depending on a forming sequence of the black matrix 180 and the color filters 191, 192, and 193.

Generally, to reduce external light reflection, a polarization film having a considerable thickness is used. Since the present embodiment may reduce external light reflection by using the color filter 190, the polarization film is not required, and thus, a thickness of the organic light-emitting display device 100 may be reduced. Accordingly, a slim-profile display device may be applied to a foldable or bendable display device.

In a comparative example, a pixel electrode having a rhombus shape or a quadrangular shape is generally used and a pixel-defining layer including an opening having a rhombus shape or a quadrangular shape, according to the shape of the pixel electrode, is used. This configuration may cause light in a specific band that is reinforced in a specific direction to be strongly reflected, and thus, a color separation phenomenon of external light may occur.

Figure 5A:
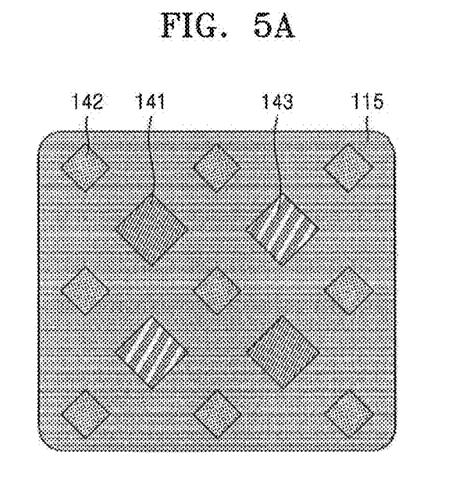
FIG. 5A is a view of an opening of a pixel-defining layer according to a comparative example.
Figure 5B:
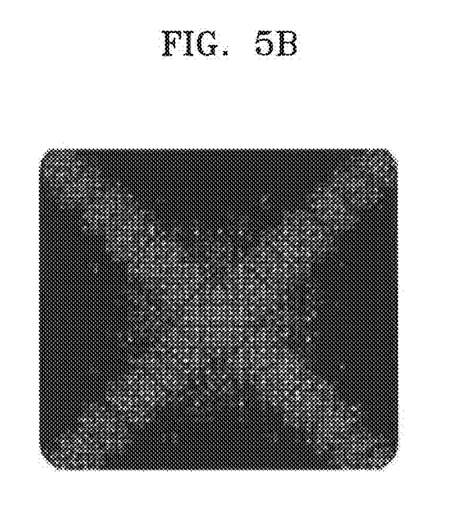
FIG. 5B is a view illustrating diffraction distribution of reflected light of FIG. 5A.

FIG. 5A is a view of an opening, of the pixel-defining layer 115, having a rhombus shape or a quadrangular shape according to a comparative example. FIG. 5B is a view illustrating diffraction distribution of reflected light of FIG. 5A.

Referring to FIG. 5A, the first to third organic emission layers 141, 142, and 143 are respectively arranged in the openings of the pixel-defining layer 115. Though not shown, the common electrode 150 is arranged on the pixel-defining layer 115 such that the common electrode 150 completely covers the pixel-defining layer, according to a comparative example.

In the case where an opening of the pixel-defining layer 115 is designed to have a rhombus shape or a quadrangular shape as in the comparative example, a reflection angle of external light incident to a portion near a vertex of each figure is reinforced in a specific direction, and thus, light in a specific band may be strongly reflected. As a result, even though a plurality of reflected light is mixed, light in a specific wavelength band may be emitted instead of white light, and thus, a display screen may take on a specific color expression.

Figure 6A:
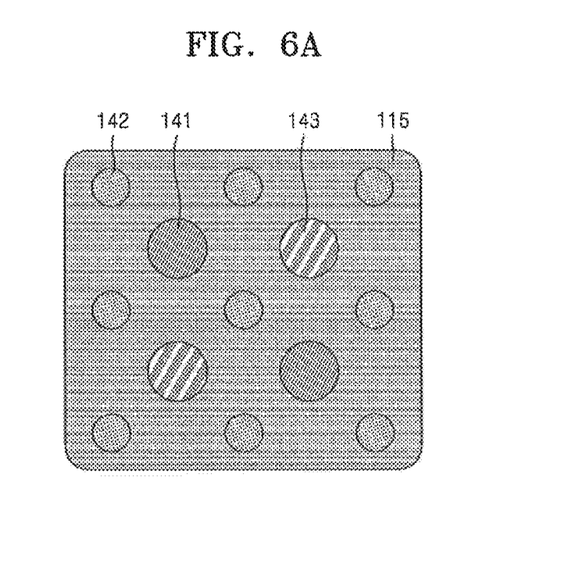
FIG. 6A is a view of an opening of a pixel-defining layer according to an exemplary embodiment of the present invention.
Figure 6B:
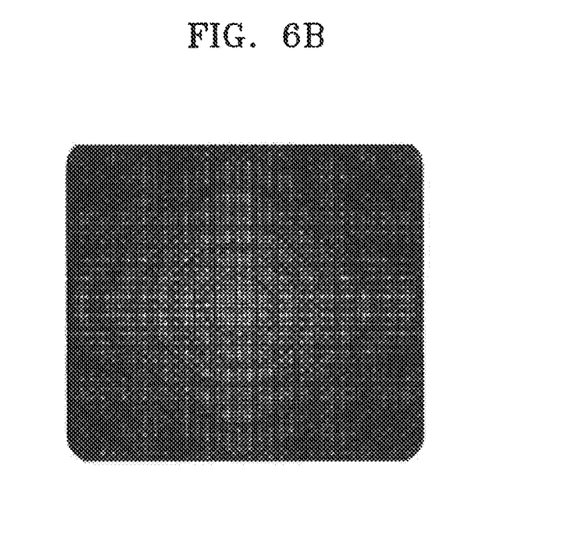
FIG. 6B is a view illustrating diffraction distribution of reflected light of FIG. 6A.

FIG. 6A is a view of the opening, of the pixel-defining layer 115, having a circular shape. FIG. 6B is a view illustrating diffraction distribution of reflected light of FIG. 6A.

Referring to FIG. 6A, the first to third organic emission layers 141, 142, and 143 are respectively arranged in the openings of the pixel-defining layer 115. Though not shown, the common electrode 150 is arranged on the pixel-defining layer 115. For example, the common electrode 150 may completely cover the pixel-defining layer.

In the case where the opening of the pixel-defining layer 115 is designed to have a circular shape as in the present embodiment, since a reflection angle of external light is an amorphous shape, the reflection angle may not be reinforced in a specific direction. In addition, wavelengths in various bands may be mixed. Thus, the external light may be reflected from the organic light-emitting display device 100 as white light. Therefore, the image emitted from the organic light-emitting diode may not be impacted by the external light because the white light does not influence an image emitted from an organic light-emitting diode.

As described above, a portion of light which is incident from the outside and passes through the color filter 190 may be prevented, and a portion of the light may be reflected by metal structures, for example, the common electrode 150 arranged between the color filter 190 and the pixel-defining layer 115 in the present embodiment.

In the present embodiment, since, like the black matrix 180, the pixel-defining layer 115 includes a light-blocking material, there is little external light reflection by metal structures, such as the pixel electrodes 131, 132, and 133, the thin film transistors TFT1, TFT2, and TFT3, and a capacitor arranged under the pixel-defining layer 115.

Therefore, the present embodiment may reduce color separation of external reflected light, and thus, increase a display quality by forming the circular first opening in the pixel-defining layer and arranging the circular second opening, which is larger than the first opening, in the black matrix and in a location overlapping the first opening.

Here, though a circular shape shown in a figure may include a constant radius, the present disclosure is not limited thereto. When a central angle of a polygon, which is formed from points of intersection of adjacent sides of a polygon, is considerably small such that reinforcement of reflected light in a specific region may be prevented, the polygon may be construed as corresponding to the circular shape of the present embodiment.

In an exemplary embodiment of the present invention, the circular first openings C11, C12, and C13 in the pixel defining layer 115 and the circular second openings C21, C22, and C23 in the black matrix 180 may have polygonal shapes. However, the present invention is not limited thereto. For example, the circular first openings C11, C12, and C13 in the pixel defining layer 115 may have a circular shape, and circular second openings C21, C22, and C23 may have a polygonal shape. As an additional example, the circular first openings C11, C12, and C13 in the pixel defining layer 115 may have a polygonal shape, and circular second openings C21, C22, and C23 may have a circular shape.

Hereinafter, an exemplary embodiment of the present invention is described with reference to FIGS. 7 to 9.

Figure 7:
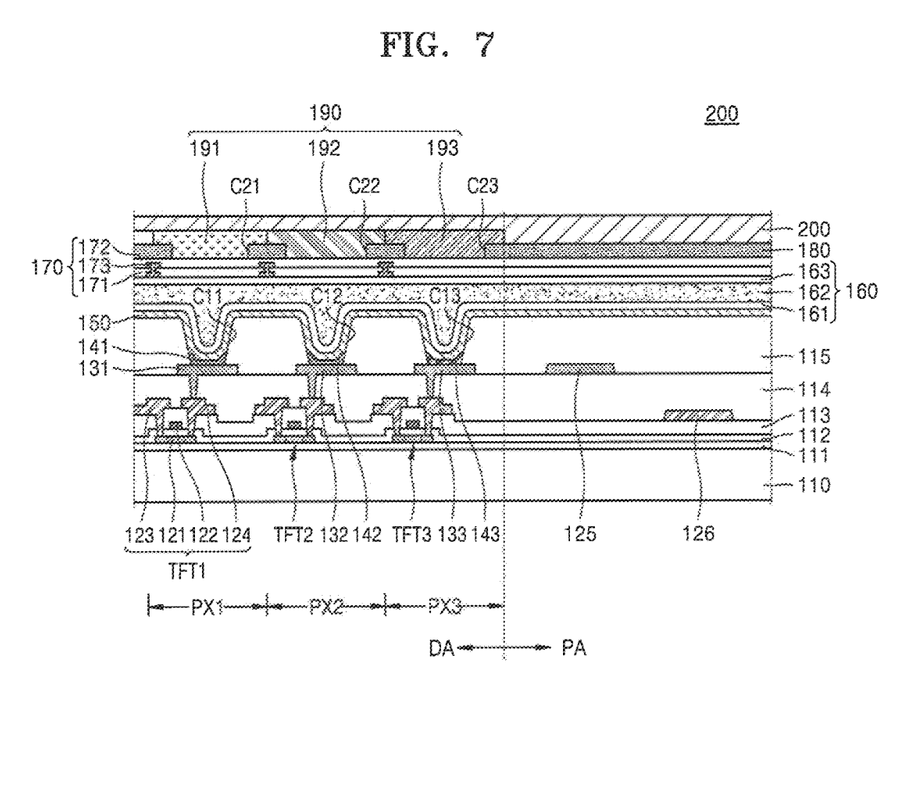
FIG. 7 is a cross-sectional view of a portion of an organic light-emitting display device according to an exemplary embodiment of the present invention.
Figure 8:
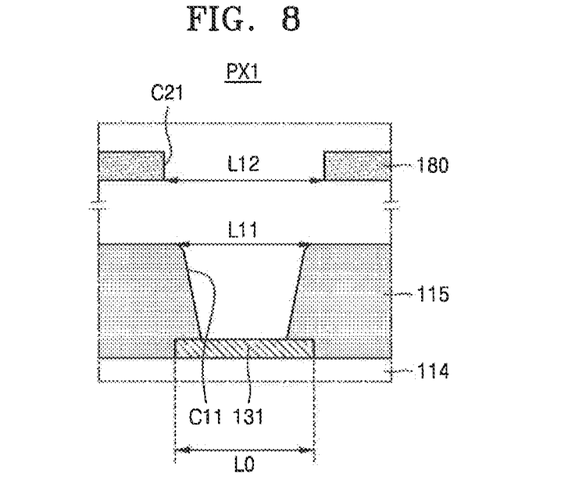
FIG. 8 is a cross-sectional view of a portion of a first pixel of FIG. 7.
Figure 9:
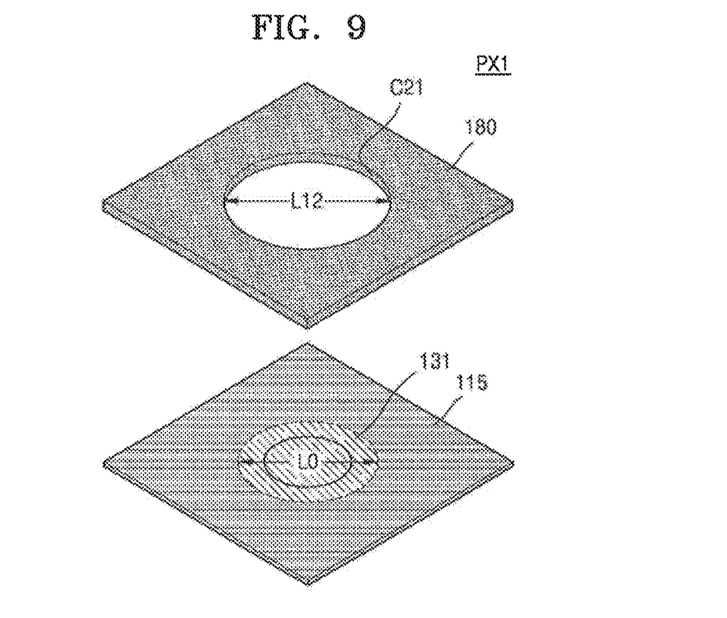
FIG. 9 is a perspective view of a portion of a first pixel of FIG. 7.

FIG. 7 is a cross-sectional view of a portion of an organic light-emitting display device 200 according to an exemplary embodiment of the present invention, FIG. 8 is a cross-sectional view of a portion of a first pixel PX1 of FIG. 7, and FIG. 9 is a perspective view of a portion of the first pixel PX of FIG. 7.

In addition, the organic light-emitting display device 200 may be substantially similar to the organic light-emitting display device 100. Compared with the organic light-emitting display device 100 according to an exemplary embodiment of the present invention, differences between the organic light-emitting display device 100 and the organic light-emitting display device 200, in FIGS. 7, 8 and 9, may be mainly described. The same reference numerals as those of the organic light-emitting display device 100 may denote the same elements.

Referring to FIGS. 7 to 9, the organic light-emitting display device 200, according to an exemplary embodiment of the present invention, includes a plurality of pixels PX1, PX2, and PX3, and includes the first, second and third pixel electrodes 131, 132, and 133, the pixel-defining layer 115 including the first openings C11, C12, and C13, the encapsulation layer 160, the black matrix 180 including circular second openings C21, C22, and C23, and the color filter 190. For example, the first, second and third pixel electrodes 131, 132, and 133 may each have a circular shape.

In the present embodiment, the circular first, second, and third pixel electrodes 131, 132, and 133, provided in the first, second, and third pixels PX1, PX2, and PX3, and the black matrix 180 overlapping the first, second, and third pixel electrodes 131, 132, and 133 and including the circular second openings C21, C22, and C23 may reduce a phenomenon that color of reflected light is separated or spread when light incident from the outside of the organic light-emitting display device 200 is reflected from the inside of the organic light-emitting display device 200 and is emitted to the outside.

The organic light-emitting display device 200 according to an exemplary embodiment of the present invention includes the display area DA and the peripheral area PA, which is a non-display area, outside the display area DA in the substrate 110. The plurality of thin film transistors TFT1, TFT2, and TFT3 are arranged over the substrate 110.

The first thin film transistor TFT1 includes the semiconductor layer 121, the gate electrode 122, the source electrode 123, and the drain electrode 124. The gate insulating layer 112 is arranged between the semiconductor layer 121 and the gate electrode 122. The interlayer insulating layer 113 is arranged between the gate electrode 122 and the source electrode 123, and between the gate electrode 122 and the drain electrode 124. The planarization layer 114 is arranged on the source electrode 123 and the drain electrode 124.

In the display area DA, the first pixel electrode 131, the second pixel electrode 132, and the third pixel electrode 133 are arranged on the planarization layer 114. The pixel electrodes 131, 132, and 133 are respectively connected to the drain electrodes 124 of each of the thin film transistors TFT1, TFT2, and TFT3 through via holes in the planarization layer 114.

Each of the pixel electrodes 131, 132, and 133 may include a reflective electrode or a transflective electrode. In the case where the pixel electrode includes a reflective electrode, the pixel electrode may include a reflective layer including at least one of, for example, Ag, Mg, Al, Pt, Pd, Au, Ni, Nd, Ir, Cr, and a compound thereof, and a transparent conductive layer arranged on/under the reflective layer. The transparent conductive layer may include at least one of, for example, ITO, IZO, ZnO, $In_2O_3$, IGO, and/or AZO.

In the present embodiment, the first pixel electrode 131, the second pixel electrode 132, and the third pixel electrode 133 each have a circular shape. Diameters of the circular pixel electrodes 131, 132, and 133 may be different from one another.

An intermediate layer including the organic emission layers 141, 142, and 143 may be arranged on the pixel electrodes 131, 132, and 133. The common electrode 150 is arranged on the organic emission layers 141, 142, and 143, respectively, of the pixels PX1, PX2, and PX3. For example, the common electrode 150 may be a single body with respect to all of the pixels. The common electrode 150 may be a transmissive electrode.

The pixel-defining layer 115 surrounds edges of the pixel electrodes 131, 132, and 133, and includes the circular first openings C11, C12, and C13 exposing central portions of the pixel electrodes 131, 132, and 133. The first openings C11, C12, and C13 may have different diameters from one another.

Unlike the above exemplary embodiment of the present invention, the pixel-defining layer 115 according to an exemplary embodiment of the present invention includes a light-transmissive material. For example, a light-blocking material is not required as in the above exemplary embodiment of the present invention. In addition, the shapes of the first openings C11, C12, and C13 in the pixel-defining layer 115 are not limited to being circular.

The encapsulation layer 160 configured to prevent penetration of moisture and oxygen included in external environment by sealing an organic light-emitting diode is provided on the common electrode 150. The encapsulation layer 160 includes the first inorganic layer 161, the organic layer 162, and the second inorganic layer 163.

The touch sense layer 170 is provided on the encapsulation layer 160. The touch sense layer 170 includes the first insulating layer 171, the second insulating layer 172 disposed on the first insulating layer 171, and the plurality of touch electrodes 173 disposed between the first insulating layer 171 and the second insulating layer 172.

The black matrix 180 and the color filter 190 are arranged on the touch sense layer 170.

Like the above exemplary embodiment of the present invention, the black matrix 180 includes a material which may block light. The black matrix 180 of the display area DA includes the circular second openings C21, C22, and C23 which respectively expose the emission regions of the pixels PX1, PX2, and PX3. The circular second openings C21, C22, and C23 of the black matrix 180 respectively overlap the first openings C11, C12, and C13 in the pixel-defining layer 115 of the pixels PX1, PX2, and PX3, and are larger than the circular first pixel electrodes 131, 132, and 133.

For example, referring to FIGS. 8 and 9, in the first pixel PX1, a diameter L12 of the second opening C21 of the black matrix 180 is larger than a diameter L0 of the circular first pixel electrode 131. When a size of the second opening C21 of the black matrix 180 increases, lateral visibility of the organic light-emitting display device 200 may increase.

The black matrix 180 of the peripheral area PA may surround the entire peripheral area PA without an opening. The black matrix 180 surrounding the peripheral area PA may reduce reflection of external light by various wirings arranged in the peripheral area PA.

The color filters 190 are respectively arranged in the emission regions of each of the pixels PX1, PX2, and PX3. For example, in the case where the first pixel PX1 emits red light, the first color filter 191 may filter the red light. In the case where the second pixel PX2 emits green light, the second color filter 192 may filter the green light. In the case where the third pixel PX3 emits blue light, the third color filter 193 may filter the blue light.

Though the color filter 190 may reduce external light reflection as described above, in the case where the pixel-defining layer 115 includes a light-transmissive material as in the present embodiment, an influence of light reflected by the pixel electrodes 131, 132, and 133 may be large compared with an influence of light reflected by the shape of the pixel-defining layer 115 or the common electrode 150.

The present embodiment may reduce color separation of external reflected light and thus increase a display quality by forming the circular pixel electrodes 131, 132, and 133 instead of pixel electrodes having a rhombus or quadrangular shape generally used in designing pixels, and arranging the circular black matrix 180 in a location overlapping the pixel electrodes 131, 132, and 133. In addition, the circular black matrix 180 has a diameter larger than the diameters of the circular pixel electrodes 131, 132, and 133.

An organic light-emitting display device according to an exemplary embodiment of the present invention may reduce color separation of external reflected light and thus increase a display quality by forming a circular first opening in a pixel-defining layer including a light-blocking material and arranging a circular second opening in a black matrix in a location overlapping the first opening. The circular second opening of the black matrix is larger than the first opening.

In addition, an organic light-emitting display device according to an exemplary embodiment of the present invention may reduce color separation of external reflected light and thus increase a display quality by forming a circular pixel electrode and arranging a circular second opening in the black matrix in a location overlapping the circular pixel electrode. The circular second opening of the black matrix has a diameter larger than that of the circular pixel electrode.

In addition, since a polarization film is not required, an organic light-emitting display device according to an exemplary embodiment of the present invention may reduce a thickness of a flexible display device.

While the present invention has been particularly shown and described with reference to exemplary embodiments thereof, it will be apparent to those of ordinary skill in the art that various changes in form and detail may be made thereto without departing from the spirit and scope of the present invention.

What is claimed is:

1. An organic light-emitting display device, comprising:
a plurality of pixels, wherein each of the plurality of pixels comprises a first electrode, a second electrode, and an organic emission layer arranged between the first electrode and the second electrode;
a pixel-defining layer surrounding an outer portion of the first electrode and comprising a plurality of circular first openings, each of the plurality of circular first openings overlapping at least a portion of a respective pixel of the plurality of pixels;
an encapsulation layer arranged on the second electrode;
a black matrix arranged on the encapsulation layer and comprising a plurality of circular second openings, each of the plurality of circular second openings overlapping a respective circular first opening of the plurality of circular first openings; and
a plurality of color filters, each of the plurality of color filters overlapping a respective circular second opening of the plurality of circular second openings,
wherein the first electrode does not overlap the black matrix.

2. The organic light-emitting display device of claim 1, wherein the pixel-defining layer comprises a light-blocking material.

3. The organic light-emitting display device of claim 2, wherein the light-blocking material comprises at least one of carbon black, a carbon nano tube (CNT), or a black dye.

4. The organic light-emitting display device of claim 1, wherein the black matrix comprises a light-blocking material.

5. The organic light-emitting display device of claim 4, wherein the light-blocking material comprises at least one of carbon black, a carbon nano tube (CNT), or a black dye.

6. The organic light-emitting display device of claim 4, wherein the black matrix is further arranged outside of a display area of the organic light-emitting display device, and wherein the plurality of pixels is arranged in the display area.

7. The organic light-emitting display device of claim 6, further comprising a touch sensing layer arranged between the encapsulation layer and the color filters.

8. The organic light-emitting display device of claim 1, wherein the encapsulation layer comprises at least one inorganic layer and at least one organic layer.

9. The organic light-emitting display device of claim 1, wherein the color filters filter colors in different bands.

10. An organic light-emitting display device:
a plurality of pixels, wherein each of the plurality of pixels comprises a first electrode, a second electrode arranged in common over the plurality of pixels, and an organic emission layer arranged between the first electrode and the second electrode, wherein the first electrode has a circular shape;
a pixel-defining layer surrounding a portion of the first electrode and comprising a first opening overlapping a first pixel of the plurality of pixels;
an encapsulation layer arranged on the second electrode;
a black matrix arranged on the encapsulation layer and comprising a circular second opening overlapping the first opening; and
a first color filter of a plurality of color filters, the first color filter overlapping the circular second opening, wherein the circular second opening is larger than the first electrode.

11. The organic light-emitting display device of claim 10, wherein the first electrode comprises a reflective material.

12. The organic light-emitting display device of claim 10, wherein the pixel-defining layer comprises a light-transmissive material.

13. The organic light-emitting display device of claim 10, wherein the black matrix comprises a light-blocking material.

14. The organic light-emitting display device of claim 13, wherein the black matrix is further arranged outside of a display area of the organic light-emitting display device, and wherein the plurality of pixels is arranged in the display area.

15. The organic light-emitting display device of claim 10, wherein the first Opening has a circular shape.

16. The organic light-emitting display device of claim 10, wherein the encapsulation layer comprises at least one inorganic layer and at least one organic layer.

17. The organic light-emitting display device of claim 16, further comprising a touch sensing layer arranged between the encapsulation layer and the color filters.

18. The organic light-emitting display device of claim 10, wherein the color filters filter colors in different bands.

19. An organic light-emitting display device, comprising:
a plurality of pixels, wherein each of the plurality of pixels comprises a first electrode, a second electrode, and an organic emission layer arranged between the first electrode and the second electrode;
a pixel-defining layer surrounding an outer portion of the first electrode and comprising a plurality of circular first openings, each of the plurality of circular first openings overlapping at least a portion of a respective pixel of the plurality of pixels;
an encapsulation layer arranged on the second electrode;
a black matrix arranged on the encapsulation layer and comprising a plurality of circular second openings, each of the plurality of circular second openings overlapping a respective circular first opening of the plurality of circular first openings; and
a plurality of color filters, each of the plurality of color filters overlapping a respective circular second opening of the plurality of circular second openings, wherein each of the plurality of circular second openings is larger than each of the plurality of circular first openings.

* * * * *